United States Patent [19]

Lofgren et al.

[11] Patent Number: 4,667,170
[45] Date of Patent: May 19, 1987

[54] VOLTAGE CONTROLLED OSCILLATOR WITH SELF-ADJUSTMENT OF OPERATING POINT

[75] Inventors: Karl M. J. Lofgren, Long Beach; Gerald W. Shearer, Orange; Charles W. Frank, Jr., Riverside, all of Calif.

[73] Assignee: Western Digital Corporation, Irvine, Calif.

[21] Appl. No.: 780,553

[22] Filed: Sep. 26, 1985

[51] Int. Cl.$^4$ .......................... H03B 5/08; H03L 7/08
[52] U.S. Cl. ........................................ 331/17; 331/25; 331/36 C; 331/177 V
[58] Field of Search ............. 331/17, 25, 36 C, 177 V, 331/117 R; 332/18, 30 V

[56] References Cited

U.S. PATENT DOCUMENTS 4,494,090 1/1985 Popek et al. ................... 331/36 C X Primary Examiner—Siegfried H. Grimm
Attorney, Agent, or Firm—Spensley Horn Jubas & Lubitz

[57] ABSTRACT

A voltage controlled oscillator includes automatic adjust circuitry to achieve and maintain desired operating characteristics such that for a predetermined output frequency the oscillator will have a predetermined input voltage. The oscillator may advantageously be incorporated into a phase locked loop circuit. The phase locked loop will lock onto the frequency of an input signal. Automatic adjust circuitry monitors the input to the voltage controlled oscillator in the phase locked loop and varies the amount of a bias voltage applied to the oscillator so that the input voltage to the oscillator will change until it reaches the desired level. The provision of the automatic adjust circuitry enables the desired operating characteristics of the oscillator to be maintained in spite of long term changes in the circuit operation.

16 Claims, 5 Drawing Figures

VOLTAGE CONTROLLED OSCILLATOR WITH SELF-ADJUSTMENT OF OPERATING POINT

BACKGROUND OF THE INVENTION

1. Field of the Invention

The present invention relates to a voltage controlled oscillator (VCO) and more particularly to a voltage controlled oscillator for use in a phase locked loop system.

A voltage controlled oscillator is an oscillator in which a change in input voltage results in a predetermined change in output frequency. Typically, frequency tuning is accomplished by changing the voltage across a varactor diode in the frequency determining resonant network of the oscillator. Voltage controlled oscillators are very often employed in phase lock loop systems. The phase locked loop system also includes a phase detector and an error amplifier. The phase detector provides an error signal that locks the voltage controlled oscillator to the frequency and phase of an incoming signal.

2. Description of the Prior Art

A typical prior art voltage controlled oscillator is illustrated in FIG. 1. The oscillator is comprised of an LC resonant circuit including capacitors 10, 12 and 14, inductor 16, inverter 18, resistor 20 and varactor diode 22. The varactor is a diode that exhibits a change in capacitance with a change in applied voltage. By changing the applied voltage at an input terminal 24, the capacitance of the varactor will change, thus changing the resonant frequency of the resonant circuit and altering the frequency of an output signal at terminal 26. A bias voltage is applied to the other terminal of the varactor to determine the operating characteristics of the oscillator, i.e., to control the voltage across the varactor so that a predetermined frequency output will be achieved for a predetermined voltage input. The bias voltage is applied by means of a bias circuit including resistors 28 and 30 and variable resistor 32. The circuit is manually adjusted by applying a predetermined voltage input to the terminal 24 and adjusting the variable resistor 32 until the desired output frequency is achieved at the output terminal 26.

As an alternative to the provision of a variable resistor which allows adjustment of the bias voltage, another prior art approach has been to employ extremely close tolerance components in the circuit to ensure that the desired operating characteristics will be achieved. This approach has the advantage that manual adjustment of the circuit is not required. However, the use of close tolerance components results in an expensive circuit.

The operating characteristics of the voltage controlled oscillator may vary over time due to various factors, thus causing the oscillator to have operating characteristics other than those desired. The prior art oscillators described above generally do not compensate for such variations. It is an object of the present invention to provide an oscillator which automatically maintains the desired operating characteristics.

SUMMARY OF THE INVENTION

The present invention provides a substantial improvement in voltage controlled oscillator performance by incorporating circuitry which modifies the bias voltage during operation of the oscillator to maintain the desired operating characteristics. The voltage controlled oscillator of the present invention includes circuitry for monitoring the input voltage to the oscillator and automatically adjusting the bias voltage applied to the other terminal of the varactor so as to maintain the desired operating characteristics of the oscillator. More specifically, the voltage controlled oscillator forms a part of a phase locked loop circuit to which an accurate reference frequency signal is applied. The output of the phase locked loop circuit is thus a signal whose frequency is equal to that of the input signal. The oscillator includes circuitry for automatically adjusting the bias voltage so that the voltage input to the oscillator from the error amplifier of the phase lock loop is at a desired level. In this fashion, the operating characteristics of the oscillator can be maintained in order to achieve optimum operation of the phase locked loop circuit.

BRIEF DESCRIPTION OF THE DRAWINGS

The invention will be described with reference to the accompanying drawings wherein.

DESCRIPTION OF THE PREFERRED EMBODIMENTS

The following description is of the best presently contemplated modes of carrying out the invention. This description is made for the purpose of illustrating the general principles of the invention and is not to be taken in a limiting sense. The scope of the invention is best determined by reference to the appended claims.

Figure 2:
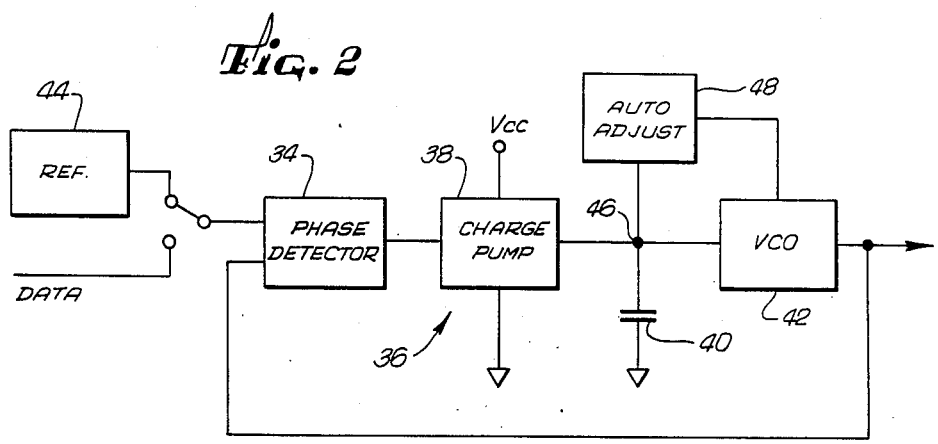
FIG. 2 is a block diagram of a phase locked loop circuit according to the present invention.

Referring to FIG. 2, a phase locked loop system includes a phase detector 34, an error amplifier 36 comprised of a charge pump 38, a low pass filter represented by a capacitor 40, and a voltage controlled oscillator 42. The output of the filter is applied as the voltage input to the VCO 42, the output of which is the output of the phase locked loop circuit. This output is also fed back to the phase detector 34. In a particular application, the phase locked loop is employed in conjunction with a data separator used to separate data from clock signals read from disc drive systems. The input to the phase detector is switchable between data from the disc and a reference signal of predetermined frequency from, for example, a crystal oscillator 44.

In the phase locked loop system, the phase detector 34 compares the phase of the two input signals and provides an output pulse, the duration of which corresponds to the phase error. This output pulse is applied to the charge pump 38 which provides a current output proportional to the phase error. This charges the capacitor 40, the voltage across which is applied as the input voltage to the VCO 42. The phase detector 34 will continue providing an error signal to the charge pump 38, which will in turn charge the capacitor 40 until the voltage across the capacitor is equal to a voltage necessary for the VCO output to have the same frequency as the input from the reference oscillator 44.

Thus, the phase locked loop circuit will lock onto the frequency of the reference signal by varying the voltage input to the VCO 42. The data rate is nominally equal to the reference frequency, and when the input of the phase detector is switched to receive data the phase lock loop circuit will track the variations in the data rate.

The charge pump is connected between a supply voltage Vcc and ground, and in order to provide maximum performance from the phase locked loop circuit it is desirable that the charge pump operate midway between these voltages, i.e., that the voltage at the input to the VCO 42 for the nominal output frequency be equal to Vcc/2. Typically, Vcc is five volts and the desired nominal input voltage is thus 2.5 volts. The charge pump 38 is most efficient when it is operating near Vcc/2. That is, as the charge pump operates to change the voltage at point 46 closer to either Vcc or ground its performance deteriorates. It is therefore desirable to maintain the point 46 at precisely Vcc/2 for the reference frequency. The present invention includes auto adjust circuitry 48 to accomplish this function. The auto adjust circuitry operates to monitor the voltage at point 46 and alter the characteristics of the VCO 42 to achieve the desired voltage of Vcc/2 when the output of the VCO 42 is at the reference frequency.

Figure 3:
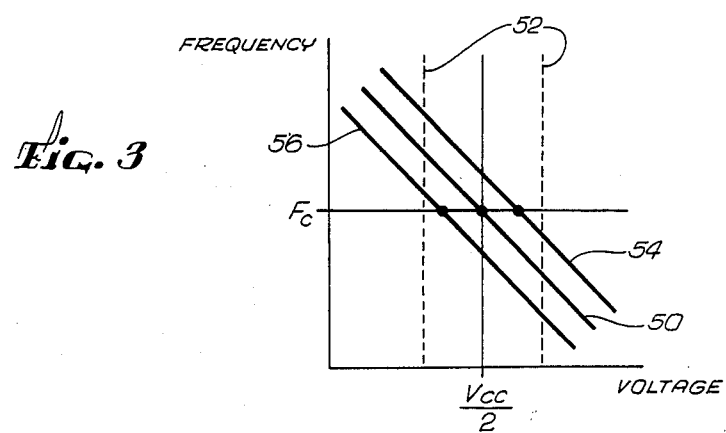
FIG. 3 is a graph of the voltage input versus frequency output characteristics of a voltage controlled oscillator.

Referring to FIG. 3, the operating characteristics of the VCO 42 are illustrated by a line 50. If the nominal output frequency of the phase locked loop circuit is Fc it is desirable to bias the VCO 42 such that this output frequency is achieved at Vcc/2. That is, the VCO 42 has an optimum transfer characteristic in which a predetermined output frequency Fc is achieved for a predetermined input voltage Vcc/2. If an operating characteristic along line 50 is achieved, changes in the frequency of the input to the phase locked loop circuit will result in changes in the voltages at point 46 which are still close to Vcc/2 and within the efficient operating range of the charge pump indicated by the area between dashed lines 52. However, if the characteristics of the VCO 42 are shifted such that the nominal frequency corresponds to an input voltage which is either higher or lower than Vcc/2 as indicated by curves 54 and 56, respectively, changes in the input frequency could result in operation of the charge pump outside of the efficient region.

Thus, for optimum operation of the phase locked loop circuit, the VCO 42 must have the desired operating characteristics in which a predetermined output frequency is obtained for a predetermined input voltage. The present invention serves not only to initially set the VCO to provide the desired operating characteristics, but also to maintain such operating characteristics over time. This is accomplished without requiring any sort of initial manual calibration or close tolerance components.

Figure 1:
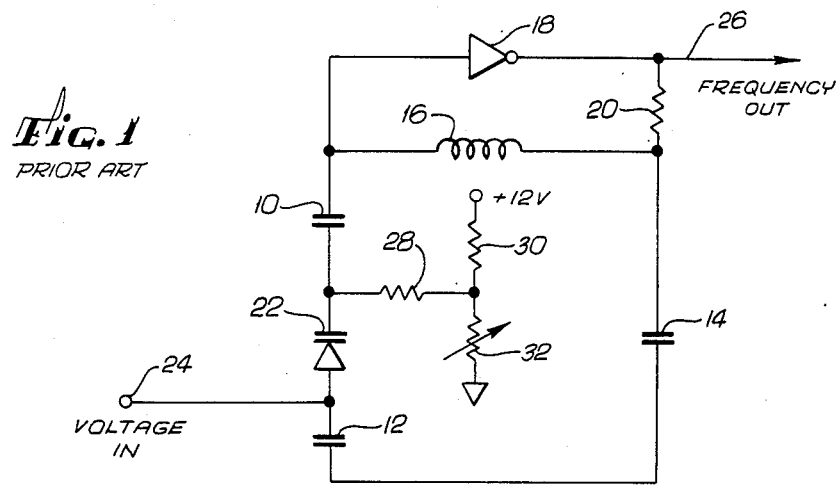
FIG. 1 is a schematic diagram of a prior art voltage controlled oscillator.
Figure 4:
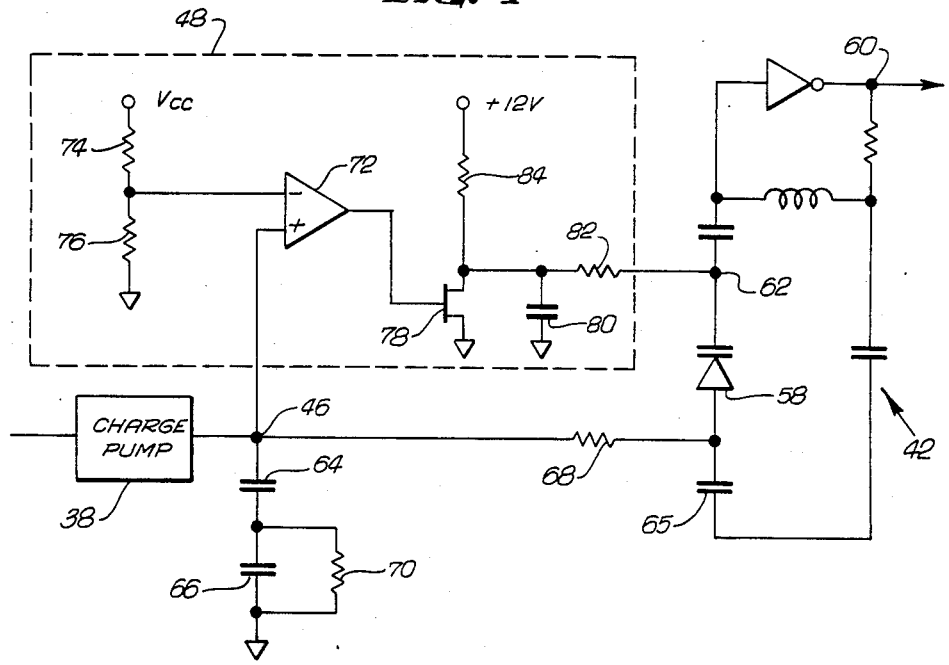
FIG. 4 is a schematic diagram of a first embodiment of a voltage controlled oscillator according to the present invention.

FIG. 4 illustrates a first embodiment of the VCO 42 and associated auto adjust circuitry 48. The VCO 42 is similar to the VCO shown in FIG. 1 in that it includes an LC resonant circuit with the output frequency determined by the voltage applied to a varactor, in this case varactor 58. When the reference signal from the oscillator 44 is applied to the phase locked loop circuit, the output terminal 60 of the VCO will achieve the desired frequency output. The auto adjust circuitry 48 operates to monitor the voltage at the point 46 and vary the bias applied to terminal 62 of the varactor 58 so that the voltage at the point 46 equals the operating voltage necessary to achieve the desired operating characteristics. Thus, the bias applied to the varactor 58 at terminal 62 is varied until the voltage at point 46 is Vcc/2.

The bias voltage at the point 62 is applied by means of a capacitor 80 via a resistor 82. The capacitor 80 is charged by means of a supply voltage, which in the illustrated embodiment is twelve volts, through a second resistor 84. The charging and discharging of the capacitor is controlled by means of a controlled impedance FET switch 78 which is driven by a comparator 72. The comparator 72 compares the voltage at the point 46 with a reference voltage supplied by means of a voltage divider including resistors 74 and 76. In the illustrated embodiment, the resistors 74 and 76 are of equal value and the reference voltage is thus equal to Vcc/2. If the voltage at point 46 goes above the reference voltage, the output of the comparator 72 will be positive and will drive the switch 78, thus providing a discharge path for the capacitor 80 and reducing the bias voltage at point 62. Through the action of the phase locked loop which serves to maintain the output frequency and thus the voltage across the varactor 58 constant, the voltage at point 46 will therefore be reduced. When the voltage at point 46 subsequently falls below the reference voltage, the switch 78 will turn off and the capacitor 80 will be slowly charged by the twelve volt supply voltage. The operation of the circuit 48 is thus a slow process in which the capacitor 80 is charged and discharged so as to maintain the bias voltage 62 at a point necessary to achieve a voltage at the point 46 equal to Vcc/2.

Capacitors 64, 65 and 66 and resistors 68 and 70 in FIG. 4 form a filter for the phase locked loop, with the capacitor 65 also forming a part of the resonator. The voltage drop across the resistor 68 is negligible and the voltage at point 46 may be considered equivalent to the voltage at the lower terminal of the varactor 58.

Figure 5:
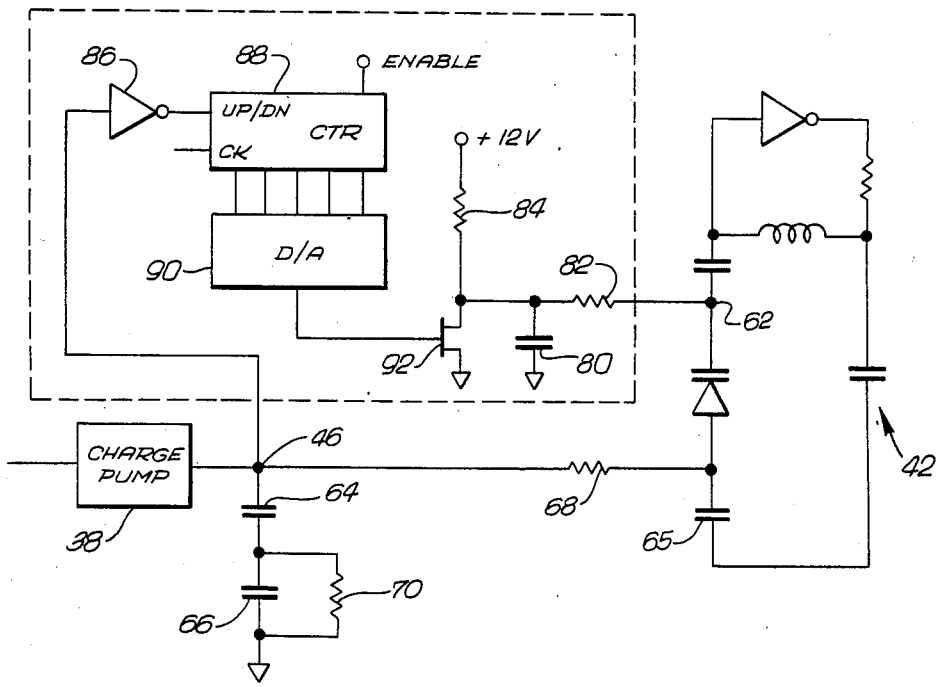
FIG. 5 is a schematic diagram of a second embodiment of a voltage controlled oscillator according to the present invention.

FIG. 5 illustrates an alternate embodiment of the invention in which the comparator and transistor switch of FIG. 4 have been replaced by an inverter 86, counter 88, digital-to-analog converter 90 and FET transistor 92. In this embodiment, the inverter is designed to have a threshold equal to the desired operating point at point 46. If the voltage at the point 46 rises above the threshold voltage of the inverter 86, the output of the inverter will go low, causing the counter 88 to count down at a predetermined clock rate. This changes the digital input and thus the analog output of the converter 90, thus altering the input drive to the FET 92. The FET 92 acts as a variable resistor and forms a voltage divider along with the resistor 84. This serves to charge the capacitor 80 to a level determined by the drive applied to the FET 92. The counter will continue to reduce its count, thus causing the converter 90 to reduce its drive to the FET 92 until the voltage at the point 62 reduces by an amount sufficient to cause the voltage at point 46 to fall below the threshold of the inverter 86. This will cause the output of the inverter 86 to go high, thus causing the counter to change its counting direction and count up. The bias voltage 62 will thus increase until the voltage at point 46 again rises above the threshold of the inverter 86. Thus, it can be seen that the bias voltage applied to point 62 will be slowly varied in order to maintain the voltage at point 46 at the desired operating point.

It should be noted that in both embodiments of the invention, the action of the auto adjust circuit 48 is relatively slow and serves to track long term variations in the input voltage to the varactor. In addition, when implemented in the phase locked loop circuit of FIG. 1, the auto adjust circuit 48 is generally operated continuously whether the reference signal or data is applied to the phase locked loop. The data rate is typically very close to the frequency of the reference oscillator 44 and the auto adjust circuit can therefore continue to operate when data is applied without adversely affecting the operation of the phase lock loop circuit. That is, minor variations in the input frequency will not result in a shifting of the bias voltage applied to the varactor. However, it may be desirable in certain applications to provide means for disabling the operation of the auto adjust circuit so as to maintain a fixed bias voltage during certain operating periods. For example, the bias voltage could be adjusted with the reference oscillator 44 connected to the input of the phase locked loop and then disabled to maintain the bias voltage fixed during the application of data to the phase locked loop. In the embodiment illustrated in FIG. 5, this may be accomplished by providing an enable control to the counter 88 which would enable its operation only when the reference oscillator 44 is connected to the phase locked loop.

Thus, the present invention provides a voltage controlled oscillator which includes automatic adjustment means for obtaining and maintaining desired operational characteristics for the oscillator, namely providing a voltage input which corresponds to a desired level for a predetermined frequency output. In an oscillator including a varactor this is accomplished by providing circuitry for monitoring the input voltage to the oscillator while the frequency output of the oscillator remains substantially constant and adjusting the bias voltage applied to the varactor until the input voltage is equal to the desired level. The circuit is particularly useful in a phase locked loop circuit in which a desired frequency output is obtained and the auto adjust circuitry is in effect a separate control loop outside of the phase locked loop. The circuitry may be designed to be relatively slow in response so that it does not affect the locking operation of the phase locked loop and will serve to compensate for long term changes in components which might alter the operating characteristics of the oscillator.

What is claimed is:

1. A voltage controlled oscillator, comprising;
    a resonant circuit having an input terminal and an output terminal, wherein the frequency of an output signal at the output terminal varies as a function of a voltage applied to the input terminal; and
    automatic adjustment means, connected to the resonant circuit, for monitoring the input at the input terminal of the resonant circuit and modifying the operation of the resonant circuit to maintain a desired operating characteristic in which the resonant circuit provides a predetermined frequency output in response to a predetermined voltage at the input terminal.

2. A voltage controlled oscillator as in claim 1 wherein:
    the resonant circuit includes a varactor, wherein a first terminal of the varactor is the input terminal and wherein the output frequency varies as a function of the voltage across the varactor; and
    the adjustment means includes means for applying a bias voltage to a second terminal of the varactor, means for monitoring the voltage applied to the input terminal and means responsive to the monitored voltage for varying the bias voltage to achieve a predetermined monitored voltage corresponding to a predetermined frequency output.

3. A voltage controlled oscillator according to claim 2 wherein the means for monitoring comprises means for comparing the voltage applied to the input terminal to a predetermined reference voltage and wherein the means for varying operates to change the bias voltage in a first direction when the voltage applied to the input terminal is greater than the reference voltage and in a second direction when the voltage applied to the input terminal is less than the reference voltage.

4. A voltage controlled oscillator according to claim 3 wherein the means for comparing includes an inverter having a switching threshold equal to the reference voltage and wherein the means for varying includes an up/down counter driven by the inverter, a digital-to-analog converter receiving the output of the counter as its input, and control means driven by the output of the digital-to-analog converter for varying the bias voltage.

5. A voltage controlled oscillator according to claim 4 wherein the control means includes:
    a capacitor, the voltage across which is applied to the resonant circuit as the bias voltage; and
    a transistor driven by the digital-to-analog converter; and
    voltage supply means for charging the capacitor under the control of the transistor.

6. A voltage controlled oscillator according to claim 3 wherein:
    the means for comparing includes a comparator receiving the reference voltage at one input and the voltage applied to the resonant circuit at another input;
    the means for varying includes (a) a capacitor, the voltage across which is applied to the resonant circuit as the bias voltage (b) supply voltage means for charging the capacitor, and (c) a transistor switch driven by the output of the comparator and coupled to the supply voltage means to control the charging of the capacitor by the supply voltage means.

7. A phase locked loop circuit having an input terminal and an output terminal, comprising:
    a phase detector for comparing the phase of a signal applied to the input terminal with the phase of the signal at the output terminal and providing an output signal representative of the phase error between the signals;
    an error amplifier for receiving the output of the phase detector and providing a voltage output representative of the phase error;
    a voltage controlled oscillator having an input terminal coupled to receive the output of the error amplifier, wherein the output of the oscillator is the output of the phase locked loop circuit and wherein the oscillator has a nominal operating characteristic in which a predetermined frequency output corresponds to a predetermined voltage input at the input terminal of the oscillator; and
    automatic adjustment means for monitoring the input voltage applied to the input terminal of the oscillator and modifying the operation of the oscillator to cause the oscillator to operate with the nominal operating characteristic.

8. A phase locked loop circuit according to claim 7, wherein the oscillator is comprised of a resonant circuit including a varactor, the varactor having a first terminal which is the input terminal of the oscillator and a second terminal having a bias voltage applied to it, wherein the voltage across the varactor determines the output frequency of the oscillator and wherein the automatic adjustment means includes means for varying the bias voltage in response to the monitored input voltage.

9. A phase locked loop circuit according to claim 8 wherein the automatic adjustment means includes means for comparing the input voltage applied to the oscillator to a reference voltage equal to said predetermined voltage input, wherein the means for varying varies the bias voltage in a first direction when the input voltage is greater than the reference voltage and in a second direction when the input voltage is less than the reference voltage.

10. A phase locked loop circuit according to claim 9, wherein:
the means for comparing includes an inverter having a threshold voltage equal to the predetermined voltage input.

11. A phase locked loop circuit according to claim 10 wherein the means for varying includes:
an up/down counter having its counting input connected to the output of the inverter; and
a digital-to-analog converter having its input connected to the output of the counter, wherein the output of the digital-to-analog converter controls the value of the bias voltage.

12. A phase locked loop circuit according to claim 11 further including:
a capacitor, the voltage across which is applied to the second terminal of the varactor as the bias voltage;
a transistor driven by the output of the digital-to-analog converter; and
voltage supply means coupled to the capacitor and transistor, wherein the supply means charges the capacitor and the transistor controls the charging thereby to control the voltage across the capacitor.

13. A phase locked loop circuit according to claim 9 wherein the means for comparing includes a comparator having a first input which receives the reference voltage and a second input which receives the input voltage applied to the oscillator.

14. A phase locked loop circuit according to claim 13 wherein the means for varying includes:
a capacitor, the voltage across which is applied to the varactor as the bias voltage;
voltage supply means connected to the capacitor for charging the capacitor; and
a transistor switch driven by the output of the comparator and connected to control the charging of the capacitor by the voltage supply means.

15. A phase locked loop circuit as in claim 8 including reference input means for providing an input signal of said predetermined frequency to the phase detector, thereby causing the output of the phase locked loop circuit to equal said predetermined frequency, wherein the automatic adjustment means varies the bias voltage in response to the monitored input voltage until the monitored input voltage is equal to said predetermined voltage input.

16. A phase locked loop circuit as in claim 8 including means for disabling operation of the automatic adjustment means and maintaining the bias voltage at its level prior to disablement.

* * * * *